United States Patent
Korolik et al.

(10) Patent No.: US 9,576,809 B2
(45) Date of Patent: Feb. 21, 2017

(54) ETCH SUPPRESSION WITH GERMANIUM

(71) Applicant: Applied Materials, Inc., Santa Clara, CA (US)

(72) Inventors: Mikhail Korolik, San Jose, CA (US);
Nitin K. Ingle, San Jose, CA (US);
Jingchun Zhang, San Jose, CA (US);
Anchuan Wang, San Jose, CA (US);
Jie Liu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 273 days.

(21) Appl. No.: 14/269,544

(22) Filed: May 5, 2014

(65) Prior Publication Data

US 2015/0126039 A1     May 7, 2015

Related U.S. Application Data

(60) Provisional application No. 61/899,798, filed on Nov. 4, 2013.

(51) Int. Cl.
*H01L 21/461* (2006.01)
*H01L 21/3065* (2006.01)
*H01J 37/32* (2006.01)

(52) U.S. Cl.
CPC ..... *H01L 21/3065* (2013.01); *H01J 37/32357* (2013.01); *H01J 2237/3346* (2013.01)

(58) Field of Classification Search
CPC ............ H01L 21/3065; H01L 21/32132; H01J 37/32357

(Continued)

(56) References Cited

U.S. PATENT DOCUMENTS 2,369,620 A    2/1945 Sullivan et al.
3,451,840 A    6/1969 Hough
(Continued)

FOREIGN PATENT DOCUMENTS

CN    1375575        10/2002
CN    1412861 A      4/2003
(Continued)

OTHER PUBLICATIONS

Manual No. TQMA72E1. "Bayard-Alpert Pirani Gauge FRG-730: Short Operating Instructions" Mar. 2012. Agilent Technologies, Lexington, MA 02421, USA. pp. 1-45.

(Continued)

*Primary Examiner* — Binh X Tran
(74) *Attorney, Agent, or Firm* — Kilpatrick Townsend & Stockton LLP

(57) ABSTRACT

Methods of selectively etching silicon relative to silicon germanium are described. The methods include a remote plasma etch using plasma effluents formed from a fluorine-containing precursor and a hydrogen-containing precursor. Plasma effluents from the remote plasma are flowed into a substrate processing region where the plasma effluents react with the silicon. The plasmas effluents react with exposed surfaces and selectively remove silicon while very slowly removing other exposed materials. The methods are useful for removing $Si_{(1-X)}Ge_X$ faster than $Si_{(1-Y)}Ge_Y$, for $X<Y$. In some embodiments, the silicon germanium etch selectivity results partly from the presence of an ion suppression element positioned between the remote plasma and the substrate processing region.

4 Claims, 5 Drawing Sheets

(58) Field of Classification Search
USPC .......................................... 438/718, 719, 727
See application file for complete search history.

(56) References Cited

U.S. PATENT DOCUMENTS

| | | |
|---|---|---|
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,690,746 A | 9/1987 | McInerney et al. |
| 4,714,520 A | 12/1987 | Gwozdz |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,838,990 A | 6/1989 | Jucha et al. |
| 4,851,370 A | 7/1989 | Doklan et al. |
| 4,857,140 A | 8/1989 | Loewenstein |
| 4,865,685 A | 9/1989 | Palmour |
| 4,868,071 A | 9/1989 | Walsh et al. |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Lowenstein et al. |
| 4,913,929 A | 4/1990 | Moslehi et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,994,404 A | 2/1991 | Sheng et al. |
| 5,000,113 A | 3/1991 | Wang et al. |
| 5,006,192 A | 4/1991 | Deguchi |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Frank |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,292,370 A | 3/1994 | Tsai et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |

(56) References Cited

U.S. PATENT DOCUMENTS

| | | |
|---|---|---|
| 5,567,243 A | 10/1996 | Foster et al. |
| 5,571,576 A | 11/1996 | Qian et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,592,358 A | 1/1997 | Shamouilian |
| 5,599,740 A | 2/1997 | Jang et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,838,055 A | 11/1998 | Kleinhenz et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,865,896 A | 2/1999 | Nowak |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,915,190 A | 6/1999 | Pirkle |
| 5,918,116 A | 6/1999 | Chittipeddi |
| 5,920,792 A | 7/1999 | Lin |
| 5,926,737 A | 7/1999 | Ameen et al. |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,147 A | 6/2000 | Koshiishi |
| 6,072,227 A | 6/2000 | Yau et al. |
| 6,074,512 A | 6/2000 | Collins et al. |
| 6,077,780 A | 6/2000 | Dubin |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,120,640 A | 9/2000 | Shih et al. |
| 6,136,163 A | 10/2000 | Cheung et al. |
| 6,136,685 A | 10/2000 | Narwankar et al. |
| 6,136,693 A | 10/2000 | Chan et al. |

(56) References Cited

U.S. PATENT DOCUMENTS

| | | |
|---|---|---|
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,161,576 A | 12/2000 | Maher et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,184,121 B1 | 2/2001 | Buchwalter et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,303,044 B1 | 10/2001 | Koemtzopoulos |
| 6,303,418 B1 | 10/2001 | Cha et al. |
| 6,306,772 B1 | 10/2001 | Lin |
| 6,312,554 B1 | 11/2001 | Ye |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,261 B1 | 1/2002 | Natzle et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,416,874 B1 | 7/2002 | McAneney |
| 6,423,284 B1 | 7/2002 | Arno |
| 6,427,623 B2 | 8/2002 | Ko |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,051 B1 | 10/2002 | Sahin et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,531,377 B2 | 3/2003 | Knorr et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |

(56) References Cited

U.S. PATENT DOCUMENTS

| | | |
|---|---|---|
| 6,645,550 B1 | 11/2003 | Cheung et al. |
| 6,656,831 B1 | 12/2003 | Lee et al. |
| 6,656,837 B2 | 12/2003 | Xu et al. |
| 6,663,715 B1 | 12/2003 | Yuda et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,867,141 B2 | 3/2005 | Jung et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuel et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,974,780 B2 | 12/2005 | Schuegraf |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,071,532 B2 | 7/2006 | Geffken et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,291,360 B2 | 11/2007 | Hanawa et al. |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,364,956 B2 | 4/2008 | Saito |
| 7,365,016 B2 | 4/2008 | Ouellet et al. |
| 7,390,710 B2 | 6/2008 | Derderian et al. |
| 7,396,480 B2 | 7/2008 | Kao et al. |
| 7,416,989 B1 | 8/2008 | Liu et al. |
| 7,465,358 B2 | 12/2008 | Weidman et al. |
| 7,468,319 B2 | 12/2008 | Lee |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,709,396 B2 | 5/2010 | Bencher et al. |
| 7,722,925 B2 | 5/2010 | White et al. |
| 7,723,221 B2 | 5/2010 | Hayashi |
| 7,749,326 B2 | 7/2010 | Kim et al. |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |

(56) References Cited

U.S. PATENT DOCUMENTS

| | | |
|---|---|---|
| 8,119,530 B2 | 2/2012 | Hori et al. |
| 8,133,349 B1 | 3/2012 | Panagopoulos |
| 8,183,134 B2 | 5/2012 | Wu |
| 8,187,486 B1 | 5/2012 | Liu et al. |
| 8,211,808 B2 | 7/2012 | Sapre et al. |
| 8,272,346 B2 | 9/2012 | Bettencourt et al. |
| 8,298,627 B2 | 10/2012 | Minami et al. |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,357,435 B2 | 1/2013 | Lubomirsky |
| 8,368,308 B2 | 2/2013 | Banna et al. |
| 8,390,980 B2 | 3/2013 | Sansoni et al. |
| 8,427,067 B2 | 4/2013 | Espiau et al. |
| 8,435,902 B2 | 5/2013 | Tang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,148 B2 | 1/2014 | Mitchell et al. |
| 8,623,471 B2 | 1/2014 | Tyler et al. |
| 8,642,481 B2 | 2/2014 | Wang et al. |
| 8,652,298 B2 | 2/2014 | Dhindsa et al. |
| 8,679,982 B2 | 3/2014 | Wang et al. |
| 8,679,983 B2 | 3/2014 | Wang et al. |
| 8,702,902 B2 | 4/2014 | Blom et al. |
| 8,741,778 B2 | 6/2014 | Yang et al. |
| 8,747,680 B1 | 6/2014 | Deshpande |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,808,563 B2 | 8/2014 | Wang et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 | 6/2015 | Ikeda et al. |
| 9,093,371 B2 | 7/2015 | Wang et al. |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,786 B1 | 10/2015 | Purayath et al. |
| 9,184,055 B2 | 11/2015 | Wang et al. |
| 9,190,293 B2 | 11/2015 | Wang et al. |
| 9,190,302 B2 | 11/2015 | Ni |
| 9,209,012 B2 | 12/2015 | Chen et al. |
| 9,236,265 B2 | 1/2016 | Korolik et al. |
| 9,236,266 B2 | 1/2016 | Zhang et al. |
| 9,245,762 B2 | 1/2016 | Zhang et al. |
| 9,263,278 B2 | 2/2016 | Purayath et al. |
| 9,269,590 B2 | 2/2016 | Luere et al. |
| 9,275,834 B1 | 3/2016 | Park et al. |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhange et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,418,858 B2 | 8/2016 | Wang et al. |
| 9,425,058 B2 | 8/2016 | Kim et al. |
| 9,437,451 B2 | 9/2016 | Chen et al. |
| 9,449,845 B2 | 9/2016 | Liu et al. |
| 9,449,846 B2 | 9/2016 | Liu et al. |
| 9,449,850 B2 | 9/2016 | Wang et al. |
| 9,472,412 B2 | 10/2016 | Zhang et al. |
| 9,472,417 B2 | 10/2016 | Ingle et al. |
| 2001/0008803 A1 | 7/2001 | Takamatsu et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0041444 A1 | 11/2001 | Shields et al. |
| 2001/0047760 A1 | 12/2001 | Mosiehl |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0055842 A1 | 12/2001 | Uh et al. |
| 2002/0000202 A1 | 1/2002 | Yuda et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |

(56) References Cited

U.S. PATENT DOCUMENTS

| | | |
|---|---|---|
| 2002/0040764 A1 | 4/2002 | Kwan et al. |
| 2002/0040766 A1 | 4/2002 | Takahashi |
| 2002/0043690 A1 | 4/2002 | Doyle et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0177322 A1 | 11/2002 | Li et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0003757 A1 | 1/2003 | Naltan et al. |
| 2003/0007910 A1 | 1/2003 | Lazarovich et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0152691 A1 | 8/2003 | Baude |
| 2003/0159307 A1 | 8/2003 | Sago et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0018304 A1 | 1/2004 | Chung et al. |
| 2004/0020801 A1 | 2/2004 | Zhao et al. |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058293 A1 | 3/2004 | Nguyen et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099378 A1 | 5/2004 | Kim et al. |
| 2004/0101667 A1 | 5/2004 | O'Loughlin et al. |
| 2004/0108068 A1 | 6/2004 | Senzaki et al. |
| 2004/0110354 A1 | 6/2004 | Natzle et al. |
| 2004/0115876 A1 | 6/2004 | Goundar et al. |
| 2004/0129224 A1 | 7/2004 | Yamazaki |
| 2004/0129671 A1 | 7/2004 | Ji et al. |
| 2004/0137161 A1 | 7/2004 | Segawa et al. |
| 2004/0144490 A1 | 7/2004 | Zhao et al. |
| 2004/0147126 A1 | 7/2004 | Yamashita et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0200499 A1 | 10/2004 | Harvey |
| 2004/0211357 A1 | 10/2004 | Gadgil et al. |
| 2004/0219737 A1 | 11/2004 | Quon |
| 2004/0219789 A1 | 11/2004 | Wood et al. |
| 2004/0245091 A1 | 12/2004 | Karim et al. |
| 2004/0263827 A1 | 12/2004 | Xu |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0051094 A1 | 3/2005 | Schaepkens et al. |
| 2005/0073051 A1 | 4/2005 | Yamamoto et al. |
| 2005/0079706 A1 | 4/2005 | Kumar et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0105991 A1 | 5/2005 | Hofmeister et al. |
| 2005/0112876 A1 | 5/2005 | Wu |
| 2005/0112901 A1 | 5/2005 | Ji et al. |
| 2005/0121750 A1 | 6/2005 | Chan et al. |
| 2005/0164479 A1 | 7/2005 | Perng et al. |
| 2005/0167394 A1 | 8/2005 | Liu et al. |
| 2005/0181588 A1 | 8/2005 | Kim |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1 | 9/2005 | Hanawa et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0239282 A1 | 10/2005 | Chen et al. |
| 2005/0251990 A1 | 11/2005 | Choi et al. |

(56) References Cited

U.S. PATENT DOCUMENTS

| | | |
|---|---|---|
| 2005/0266622 A1 | 12/2005 | Arghavani et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019486 A1 | 1/2006 | Yu et al. |
| 2006/0021574 A1 | 2/2006 | Armour et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0060942 A1 | 3/2006 | Minixhofer et al. |
| 2006/0087644 A1 | 4/2006 | McMillin et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0118178 A1 | 6/2006 | Desbiolles et al. |
| 2006/0121724 A1 | 6/2006 | Yue et al. |
| 2006/0124242 A1 | 6/2006 | Kanarik et al. |
| 2006/0130971 A1 | 6/2006 | Chang et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0178008 A1 | 8/2006 | Yeh et al. |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0210723 A1 | 9/2006 | Ishizaka |
| 2006/0211260 A1 | 9/2006 | Tran et al. |
| 2006/0216878 A1 | 9/2006 | Lee |
| 2006/0216923 A1 | 9/2006 | Tran et al. |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264003 A1 | 11/2006 | Eun |
| 2006/0264043 A1 | 11/2006 | Stewart et al. |
| 2006/0266288 A1 | 11/2006 | Choi |
| 2006/0292846 A1 | 12/2006 | Pinto et al. |
| 2007/0025907 A1 | 2/2007 | Rezeq |
| 2007/0048977 A1 | 3/2007 | Lee et al. |
| 2007/0056925 A1 | 3/2007 | Liu et al. |
| 2007/0062453 A1 | 3/2007 | Ishikawa |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0131274 A1 | 6/2007 | Stollwerck et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0269976 A1 | 11/2007 | Futase et al. |
| 2007/0277734 A1 | 12/2007 | Lubomirsky et al. |
| 2007/0281106 A1 | 12/2007 | Lubomirksy et al. |
| 2007/0287292 A1 | 12/2007 | Li et al. |
| 2007/0296967 A1 | 12/2007 | Gupta et al. |
| 2008/0017104 A1 | 1/2008 | Matyushkin et al. |
| 2008/0020570 A1 | 1/2008 | Naik |
| 2008/0044990 A1 | 2/2008 | Lee |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0102570 A1 | 5/2008 | Fisher et al. |
| 2008/0102640 A1 | 5/2008 | Hassan et al. |
| 2008/0104782 A1 | 5/2008 | Hughes |
| 2008/0115726 A1 | 5/2008 | Ingle et al. |
| 2008/0121970 A1 | 5/2008 | Aritome |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0162781 A1 | 7/2008 | Haller et al. |
| 2008/0171407 A1 | 7/2008 | Nakabayashi et al. |
| 2008/0173906 A1 | 7/2008 | Zhu |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0202892 A1 | 8/2008 | Smith et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0001480 A1 | 1/2009 | Cheng |
| 2009/0004849 A1 | 1/2009 | Eun |

(56) References Cited

U.S. PATENT DOCUMENTS

| | | |
|---|---|---|
| 2009/0014127 A1 | 1/2009 | Shah et al. |
| 2009/0017227 A1 | 1/2009 | Fu et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095621 A1 | 4/2009 | Kao et al. |
| 2009/0098706 A1 | 4/2009 | Kim et al. |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0111280 A1 | 4/2009 | Kao et al. |
| 2009/0120464 A1 | 5/2009 | Rasheed et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0294898 A1 | 12/2009 | Feustel et al. |
| 2009/0317978 A1 | 12/2009 | Higashi |
| 2009/0320756 A1 | 12/2009 | Tanaka |
| 2010/0003824 A1 | 1/2010 | Kadkhodayan et al. |
| 2010/0022030 A1 | 1/2010 | Ditizio |
| 2010/0047080 A1 | 2/2010 | Bruce |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0130001 A1 | 5/2010 | Noguchi |
| 2010/0144140 A1 | 6/2010 | Chandrashekar et al. |
| 2010/0147219 A1 | 6/2010 | Hsieh et al. |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207205 A1 | 8/2010 | Grebs et al. |
| 2010/0240205 A1 | 9/2010 | Son |
| 2010/0258913 A1 | 10/2010 | Lue |
| 2010/0294199 A1 | 11/2010 | Tran et al. |
| 2010/0330814 A1 | 12/2010 | Yokota et al. |
| 2011/0005607 A1 | 1/2011 | Desbiolles et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0045676 A1 | 2/2011 | Park |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0081782 A1 | 4/2011 | Liang et al. |
| 2011/0100489 A1 | 5/2011 | Orito |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0143542 A1 | 6/2011 | Feurprier et al. |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165771 A1 | 7/2011 | Ring et al. |
| 2011/0180847 A1 | 7/2011 | Ikeda et al. |
| 2011/0195575 A1 | 8/2011 | Wang |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230052 A1 | 9/2011 | Tang et al. |
| 2011/0232737 A1 | 9/2011 | Ruletzki et al. |
| 2011/0266252 A1 | 11/2011 | Thadani et al. |
| 2011/0266682 A1 | 11/2011 | Edelstein et al. |
| 2011/0294300 A1 | 12/2011 | Zhang et al. |
| 2011/0298061 A1 | 12/2011 | Siddiqui et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0052683 A1 | 3/2012 | Kim et al. |
| 2012/0068242 A1 | 3/2012 | Shin et al. |
| 2012/0103518 A1 | 5/2012 | Kakimoto |
| 2012/0104564 A1 | 5/2012 | Won et al. |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0180954 A1 | 7/2012 | Yang et al. |
| 2012/0181599 A1 | 7/2012 | Lung |
| 2012/0182808 A1 | 7/2012 | Lue et al. |
| 2012/0196447 A1 | 8/2012 | Yang et al. |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0238102 A1 | 9/2012 | Zhang et al. |
| 2012/0238103 A1 | 9/2012 | Zhang et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0258600 A1 | 10/2012 | Godet et al. |
| 2012/0267346 A1 | 10/2012 | Kao et al. |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0001899 A1 | 1/2013 | Hwang et al. |
| 2013/0005103 A1 | 1/2013 | Liu et al. |
| 2013/0005140 A1 | 1/2013 | Jeng et al. |

(56) References Cited

U.S. PATENT DOCUMENTS

| | | |
|---|---|---|
| 2013/0012032 A1 | 1/2013 | Liu et al. |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0089988 A1* | 4/2013 | Wang .............. H01J 37/32357 438/719 |
| 2013/0098868 A1 | 4/2013 | Nishimura et al. |
| 2013/0105948 A1 | 5/2013 | Kewley |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0150303 A1 | 6/2013 | Kungl et al. |
| 2013/0161726 A1 | 6/2013 | Kim et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0217243 A1 | 8/2013 | Underwood et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0279066 A1 | 10/2013 | Lubomirsky et al. |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0284374 A1 | 10/2013 | Lubomirsky et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2013/0343829 A1 | 12/2013 | Benedetti et al. |
| 2014/0004707 A1* | 1/2014 | Thedjoisworo ..... H01L 21/3065 438/719 |
| 2014/0004708 A1 | 1/2014 | Thedjoisworo |
| 2014/0020708 A1 | 1/2014 | Kim et al. |
| 2014/0021673 A1 | 1/2014 | Chen et al. |
| 2014/0057447 A1 | 2/2014 | Yang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0124364 A1 | 5/2014 | Yoo et al. |
| 2014/0134847 A1 | 5/2014 | Seya |
| 2014/0141621 A1 | 5/2014 | Ren et al. |
| 2014/0152312 A1 | 6/2014 | Snow et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0186772 A1 | 7/2014 | Pohlers et al. |
| 2014/0190410 A1 | 7/2014 | Kim |
| 2014/0199851 A1 | 7/2014 | Nemani et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263272 A1 | 9/2014 | Duan et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0060265 A1 | 3/2015 | Cho et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0118858 A1 | 4/2015 | Takaba |
| 2015/0126035 A1 | 5/2015 | Diao et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0152072 A1 | 6/2015 | Cantat et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221541 A1 | 8/2015 | Nemani et al. |
| 2015/0235809 A1 | 8/2015 | Ito et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0294980 A1 | 10/2015 | Lee et al. |
| 2015/0332930 A1 | 11/2015 | Wang et al. |
| 2015/0340225 A1 | 11/2015 | Kim et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2016/0005572 A1 | 1/2016 | Liang et al. |
| 2016/0005833 A1 | 1/2016 | Collins et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042968 A1 | 2/2016 | Purayath et al. |
| 2016/0056167 A1 | 2/2016 | Wang et al. |
| 2016/0064233 A1 | 3/2016 | Wang et al. |
| 2016/0079072 A1 | 3/2016 | Wang et al. |
| 2016/0086807 A1 | 3/2016 | Park et al. |

(56) References Cited

U.S. PATENT DOCUMENTS

| | | |
|---|---|---|
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0104606 A1 | 4/2016 | Park et al. |
| 2016/0118268 A1 | 4/2016 | Ingle et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0181112 A1 | 6/2016 | Xue et al. |
| 2016/0189933 A1 | 6/2016 | Kobayashi et al. |
| 2016/0204009 A1 | 7/2016 | Nguyen et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |

FOREIGN PATENT DOCUMENTS

| | | |
|---|---|---|
| CN | 101465386 A | 6/2009 |
| EP | 0329406 | 8/1989 |
| EP | 0376252 A2 | 7/1990 |
| EP | 0475567 | 3/1992 |
| EP | 0 496 543 A2 | 7/1992 |
| EP | 0 658 928 A1 | 6/1995 |
| EP | 0697467 A1 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| EP | 1675160 A1 | 6/2006 |
| GB | 2285174 | 6/1995 |
| JP | S59-126778 A | 7/1984 |
| JP | 61-276977 A | 12/1986 |
| JP | H01-200627 A | 8/1989 |
| JP | 2058836 A | 2/1990 |
| JP | H02-114525 A | 4/1990 |
| JP | 02-121330 A | 5/1990 |
| JP | 02256235 | 10/1990 |
| JP | 4-239750 | 7/1992 |
| JP | 4-341568 A | 11/1992 |
| JP | 07-130713 A | 5/1995 |
| JP | 7-161703 A | 6/1995 |
| JP | H07-153739 A | 6/1995 |
| JP | 7297543 | 11/1995 |
| JP | H08-264510 A | 10/1996 |
| JP | 08-306671 A | 11/1996 |
| JP | 09153481 A | 6/1997 |
| JP | 09-205140 A | 8/1997 |
| JP | 10-178004 A | 6/1998 |
| JP | 2010-154699 | 6/1998 |
| JP | 11124682 | 5/1999 |
| JP | H11-204442 | 7/1999 |
| JP | 2000-012514 A | 1/2000 |
| JP | 2001-308023 | 11/2001 |
| JP | 2002-100578 | 4/2002 |
| JP | 2002-141349 | 5/2002 |
| JP | 2002-222861 A | 8/2002 |
| JP | 2003-019433 | 1/2003 |
| JP | 2003-059914 | 2/2003 |
| JP | 2003-174020 A | 6/2003 |
| JP | 2003-179038 A | 6/2003 |
| JP | 2003-217898 | 7/2003 |
| JP | 2003-318158 A | 11/2003 |
| JP | 2003-347278 A | 12/2003 |
| JP | 2004-047956 A | 2/2004 |
| JP | 2004-156143 A | 6/2004 |
| JP | 04-239723 A | 8/2004 |
| JP | 2005-033023 A | 2/2005 |
| JP | 2007-173383 A | 7/2007 |
| JP | 08-148470 A | 6/2008 |
| JP | 2009-044129 A | 2/2009 |
| JP | 4763293 B2 | 8/2011 |
| JP | 2013-243418 A | 12/2013 |
| KR | 10-0155601 B1 | 12/1998 |
| KR | 10-0236219 B1 | 12/1999 |
| KR | 10-2000-008278 A | 2/2000 |
| KR | 1020000008278 A | 2/2000 |
| KR | 2000-0044928 | 7/2000 |
| KR | 2001-0014064 A | 2/2001 |
| KR | 10-2001-0049274 A | 6/2001 |
| KR | 10-2001-0058774 A | 7/2001 |
| KR | 10-2001-0082109 | 8/2001 |
| KR | 10-2003-0054726 A | 7/2003 |
| KR | 1020030081177 | 10/2003 |
| KR | 1020030096140 | 12/2003 |
| KR | 10-2004-0049739 A | 6/2004 |
| KR | 10-2004-0096365 A | 11/2004 |
| KR | 10-2005-0042701 A | 5/2005 |
| KR | 1020050042701 A | 5/2005 |
| KR | 10-0681390 | 9/2006 |
| KR | 10-2008-0013174 A | 2/2008 |
| KR | 10-2008-0063988 A | 7/2008 |
| KR | 1020080063988 A | 7/2008 |
| KR | 10-2009-0080533 A | 7/2009 |
| KR | 10-2009-0128913 A | 12/2009 |
| KR | 10-2010-0013980 A | 2/2010 |
| KR | 10-2010-0074508 A | 7/2010 |
| KR | 10-2010-0075957 A | 7/2010 |
| KR | 10/2010/0083629 A | 7/2010 |
| KR | 10-2010-0099535 A | 9/2010 |
| KR | 10-2011-0086540 A | 7/2011 |
| KR | 10-1050454 B1 | 7/2011 |
| KR | 10-2011-0126675 A | 11/2011 |
| KR | 1020110126675 A | 11/2011 |
| KR | 10-2012-0082640 A | 7/2012 |
| KR | 1020120082640 A | 7/2012 |
| WO | 92/20833 A1 | 11/1992 |
| WO | 99/26277 A1 | 5/1999 |
| WO | 99/54920 A2 | 10/1999 |
| WO | 99/62108 A2 | 12/1999 |
| WO | 00/13225 A1 | 3/2000 |
| WO | 00/22671 | 4/2000 |
| WO | 01/94719 A1 | 12/2001 |
| WO | 02083981 A2 | 10/2002 |
| WO | 03014416 | 2/2003 |
| WO | 2004/006303 | 1/2004 |
| WO | 2004/074932 | 9/2004 |
| WO | 2004/114366 A2 | 12/2004 |
| WO | 2005036615 A2 | 4/2005 |
| WO | 2006/069085 A2 | 6/2006 |
| WO | 2009/071627 A2 | 6/2009 |
| WO | 2009-084194 A1 | 7/2009 |
| WO | 2010-010706 | 1/2010 |
| WO | 2011/087580 A1 | 7/2011 |
| WO | 2011/115761 A2 | 9/2011 |
| WO | 2011/139435 A2 | 11/2011 |
| WO | 2012/018449 A2 | 2/2012 |
| WO | 2012/125654 A2 | 9/2012 |

OTHER PUBLICATIONS

Derwent 2006-065772, Formation of multilayer enscapulating film over substrate, e.g. displace device, comprising delivering mixture precursors and hydrogen gas into substrate processing system, 2006.

Abe et al., "Developments of plasma etching technology for fabricating semiconductor devices," Jpn. J. Appl. Phys., vol. 47, No. 3R, Mar. 2008, 21 pgs.

Cho et al., "Dielectric-barrier microdischarge structure for efficient positive-column plasma using a thick-film ceramic sheet," IEEE Trans. Plasma Sci., vol. 37, No. 8, Aug. 2009, 4 pgs.

Cho, T.S., "Dual Discharge Modes Operation of an Argon Plasma Generated by Commercial Electronic Ballast for Remote Plasma Removal Process," IEEE Transactions on Plasma Science, vol. 42, No. 6, , Jun. 2014, 4 pages.

(56) References Cited

OTHER PUBLICATIONS

Cho et al., "Three-dimensional spatiotemporal behaviors of light emission from discharge plasma of alternating current plasma display panels," Appl. Phys. Lett. , vol. 92, No. 22, Jun. 2008, 3pgs.
Cho et al., "Analysis of address discharge modes by using a three-dimensional plasma display panel," IEEE Trans. Plasma Sci. , vol. 36, Oct. 2008, 4 pgs.
C.K. Hu, et al. "Reduced Electromigration of Cu Wires by Surface Coating" Applied Physics Letters, vol. 81, No. 10, Sep. 2, 2002—pp. 1782-1784.
European Search Report dated May 23, 2006 for EP Application No. 05251143.3.
European Examination Report dated Nov. 13, 2007 for Ep Application No. 05251143.3.
EP Partial Search Report, Application No. 08150111.601235/1944796, dated Aug. 22, 2008.
Eze, F. C., "Electroless deposition of CoO thin films," J. Phys. D: Appl. Phys. 32 (1999), pp. 533-540.
Galiano et al. "Stress-Temperature Behavior of Oxide Films Used for Intermetal Dielectric Applications", VMIC Conference, Jun. 9-10, 1992, pp. 100-106.
Goebels, F.J. et al. "Arbitrary Polarization from Annular Slot Planar Antennas." Ire Transactions on Antennas and Propagation, Jul. 1961, 8 pgs.
Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.
International Search Report of PCT/US2009/059743 mailed on Apr. 26, 2010, 4 pages.
International Search Report of PCT/US2012/061726 mailed on May 16, 2013, 3 pages.
International Search Report of PCT/2013/052039 mailed on Nov. 8, 2013, 9 pages.
International Search Report of PCT/2013/037202 mailed on Aug. 23, 2013, 11 pages.
Kim et al., "Pendulum electrons in micro hollow cathode di scharges," IEEE Trans. Plasma Sci. , vol. 36, No. 4, pp. Aug. 2008, 2 pgs.
Lin, et al., "Manufacturing of Cu Electroless Nickel/Sn—Pb Flip Chip Solder Bumps", IEEE Transactions on Advanced Packaging, vol. 22, No. 4 (Nov. 1999), pp. 575-579.
Lopatin, et al., "Thin Electroless barrier for copper films", Part of the SPIE Conference of Multilevel Interconnect technology II, SPIE vol. 3508 (1998), pp. 65-77.
Musaka, "Single Step Gap Filling Technology fo Subhalf Micron Metal Spacings on Plasma Enhanced $TEOS/O_2$ Chemical Vapor Deposition System," Extended Abstracts of the 1993 International Conference on Solid State Devices and Materials pages, 1993, 510-512.
Pearlstein, Fred. "Electroless Plating," J. Res. Natl. Bur. Stan., Ch. 31 (1974), pp. 710-747.
Redolfi et al., "Bulk FinFET fabrication with new approaches for oxide topography control using dry removal techniques," Solid-State Electron., vol. 71, May 2012, 7 pgs.
Saito, et al., "Electroless deposition of Ni—B, Co—B and Ni—Co—B alloys using dimethylamineborane as a reducing agent," Journal of Applied Electrochemistry 28 (1998), pp. 559-563.
Schacham-Diamond, et al., "Electrochemically deposited thin film alloys for ULSI and MEMS applications," Microelectronic Engineering 50 (2000), pp. 525-531.
Schacham-Diamond, et al. "Material properties of electroless 100-200 nm thick CoWP films," Electrochemical Society Proceedings, vol. 99-34, pp. 102-110.
Schoenbach et al.,"High-pressure hollow cathode di scharges," Plasma Sources Sci. Te chnol.,vol. 6, No. 4, Nov. 1997, 10 pgs.
Smayling, et al., "APF® Pitch-Halving for 2nm Logic Cells using Gridded Design Rules", proceedings of the SPIE, 2008, 8 pages.
Vassiliev, et al., "Trends in void-free pre-metal CVD dielectrics," Solid State Technology, Mar. 2001, pp. 129-136.
Weston, et al., "Ammonium Compounds," Kirk-Othmer Encyclopedia of Chemical Technology, 2003,30 pages see pp. 717-718, John Wiley & Sons, Inc.
Yasaka, Y. et al. "Planar microwave discharges with active control of plasma uniformity". Physics of Plasmas, vol. 9 No. 3, Mar. 2002, 7 pgs.
Yosi Shacham-Diamond, et al. "High Aspect Ratio Quarter-Micron Electroless Copper Integrated Technology", Microelectronic Engineering 37/38 (1997) pp. 77-88.
Abraham, "Reactive Facet Tapering of Plasma Oxide for Multilevel Interconnect Applications", IEEE, V-MIC Conference, Jun. 15-16, 1987, pp. 115-121.
Applied Materials, Inc., "Applied Siconi™ Preclean," printed on Aug. 7, 2009, 8 pages.
Carlson, et al., "A Negative Spacer Lithography Process for Sub-100nm Contact Holes and Vias", University of California at Berkeley, Jun. 19, 2007, 4 pp.
Chang et al. "Frequency Effects and Properties of Plasma Deposited Fluorinated Silicon Nitride", J. Vac Sci Technol B 6(2), Mar./Apr. 1988, pp. 524-532.
Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.
Examination Report dated Jun. 28, 2010 for European Patent Application No. 05251143.3. I.
Fukada et al., "Preparation of SiOF Films with Low Dielectric Constant by ECR Plasma CVD," ISMIC, DUMIC Conference, Feb. 21-22, 1995, pp. 43-49.
Hashim et al., "Characterization of thin oxide removal by RTA Treatment," ICSE 1998 Proc. Nov. 1998, Rangi, Malaysia, pp. 213-216.
Hausmann, et al., "Rapid Vapor Deposition of Highly Conformal Silica Nanolaminates," Science, Oct. 11, 2002, p. 402-406, vol. 298.
Hayasaka, N. et al. "High Quality Low Dielectric Constant SiO2 CVD Using High Density Plasma," Proceedings of the Dry Process Symposium, 1993, pp. 163-168.
Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.
International Search Report and Written Opinion of the International Searching Authority mailed Jul. 3, 2008 (PCT/US05/46226).
International Search Report and Written Opinion for PCT Application No. PCT/US2011/027221, mailed on Nov. 1, 2011, 8 pages.
International Search Report and Written Opinion of PCT/US2010/057676 mailed on Jun. 27, 2011, 9 pages.
International Search Report and Written Opinion of PCT/US2011/030582 mailed Dec. 7, 2011, 9 pages.
International Search Report and Written Opinion of PCT/US2011/064724 mailed on Oct. 12, 2012, 8 pages.
International Search Report and Written Opinion of PCT/US2012/028952 mailed on Oct. 29, 2012, 9 pages.
International Search Report and Written Opinion of PCT/US2012/048842 mailed on Nov. 28, 2012, 10 pages.
International Search Report and Written Opinion of PCT/US2012/053329 mailed on Feb. 15, 2013, 8 pages.
International Search Report and Written Opinion of PCT/US2012/057294 mailed on Mar. 18, 2013, 12 pages.
International Search Report and Written Opinion of PCT/US2012/057358 mailed on Mar. 25, 2013, 10 pages.
International Search Report and Written Opinion of PCT/US2012/058818 mailed on Apr. 1, 2013, 9 pages.
International Search Report and Written Opinion of the International Searching Authority for PCT Application No. PCT/US2012/028957, mailed on Oct. 18, 2012, 9 pages.
International Search report and Written Opinion of PCT/CN2010/000932 dated Mar. 31, 2011, 8 pages.
Japanese Patent Office, Official Action for Application No. 2007-317207 mailed on Dec. 21, 2011, 2 pages.
International Search Report and Written Opinion of PCT/US2013/076217 mailed on Apr. 28, 2014, 11 pages.

(56) References Cited

OTHER PUBLICATIONS

Jung, et al., "Patterning with amorphous carbon spacer for expanding the resolution limit of current lithography tool", Proc. SPIE, 2007, 9 pages, vol. 6520, 65201C.
Laxman, "Low ε Dielectrics: CVD Fluorinated Silicon Dioxides", Semiconductor International, May 1995, pp. 71-74.
Lee, et al., "Dielectric Planarization Techniques for Narrow Pitch Multilevel Interconnects," IEEE, V-MIC Conference Jun. 15-16, 1987, pp. 85-92 (1987).
Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.
Meeks, Ellen et al., "Modeling of $SiO_2$ deposition in high density plasma reactors and comparisons of model predictions with experimental measurements," J. Vac. Sci. Technol. A, Mar./Apr. 1998, pp. 544-563, vol. 16(2).
Mukai, et al., "A Study of CD Budget in Spacer Patterning Process", Toshiba, SPIE 2008, Feb. 26, 2008, 12 pages.
Nishino, et al.; Damage-Free Selective Etching of SI Native Oxides Using NH3/NF3 and SF6/H20 Down-Flow Etching, The Japanese Society of Applied Physics, vol. 74, No. 2, pp. 1345-1348, XP-002491959, Jul. 15, 1993.
Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.
Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.
Qian, et al., "High Density Plasma Deposition and Deep Submicron Gap Fill with Low Dielectric Constant SiOF Films," ISMIC, DUMIC Conference Feb. 21-22, 1995, 1995, pp. 50-56.
Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.
Shapiro, et al. "Dual Frequency Plasma CVD Fluorosilicate Glass: Water Absorption and Stability", ISMIC, DUMIC Conference Feb. 21-22, 1995, 1995. pp. 118-123.
S.M. Sze, VLSI Technology, McGraw-Hill Book Company, pp. 107, 108.
C.C. Tang and D. W. Hess, Tungsten Etching in CF4 and SF6 Discharges, J. Electrochem. Soc., 1984, 131 (1984) p. 115-120.
Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.
Wang et al.; Ultra High-selectivity silicon nitride etch process using an inductively coupled plasma source; J. Vac. Sci. Techno!. A 16(3),May/Jun. 1998, pp. 1582-1587.
Wolf et al.; Silicon Processing for the VLSI Era; vol. 1; 1986; Lattice Press, pp. 546, 547, 618, 619.
Yang, R., "Advanced in situ pre-Ni silicide (Siconi) cleaning at 65 nm to resolve defects in NiSix modules," J. Vac. Sci., Technol. B, Microelectron. Nanometer Struct., vol. 28, No. 1, Jan. 2010, 6 pgs.
Yasuda et al., "Dual-function remote plasma etching/cleaning system applied to selective etching of Si02 and removal of polymeric residues," J. Vac. Sci. Technol., A, vol. 11, No. 5, 1993, 12 pgs.
Yu, et al., "Step Coverage Study of Peteos Deposition for Intermetal Dielectric Applications," abstract, VMIC conference, Jun. 12-13, 1990, 7 pages, No. 82.
Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.
H. Xiao, Introduction to Semiconductor Manufacturing Technology, published by Prentice Hall, 2001, ISBN 0-13-022404-9, pp. 354-356.

\* cited by examiner

ETCH SUPPRESSION WITH GERMANIUM

CROSS-REFERENCES TO RELATED APPLICATIONS

This application claims the benefit of U.S. Prov. Pat. App. No. 61/899,798 by Korolik et al., filed Nov. 4, 2013, and titled "ETCH SUPPRESSION WITH GERMANIUM," which is hereby incorporated herein by reference for all purposes.

FIELD

This invention relates to cleaning and selectively etching or retaining silicon germanium.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective of the first material. As a result of the diversity of materials, circuits and processes, etch processes have been developed that selectively remove one or more of a broad range of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Remote plasma etch processes have recently been developed to selectively remove a variety of dielectrics relative to one another. However, few dry-etch processes have been developed to selectively remove silicon while retaining silicon germanium.

Methods are needed to selectively etch metal oxides using dry etch processes.

SUMMARY

Methods of selectively etching silicon relative to silicon germanium are described. The methods include a remote plasma etch using plasma effluents formed from a fluorine-containing precursor and a hydrogen-containing precursor. Plasma effluents from the remote plasma are flowed into a substrate processing region where the plasma effluents react with the silicon. The plasmas effluents react with exposed surfaces and selectively remove silicon while very slowly removing other exposed materials. The methods are useful for removing $Si_{(1-X)}Ge_X$ faster than $Si_{(1-Y)}Ge_Y$ for X<Y. In some embodiments, the silicon germanium etch selectivity results partly from the presence of an ion suppression element positioned between the remote plasma and the substrate processing region.

Embodiments include methods of etching silicon. The methods include flowing a fluorine-containing precursor and a hydrogen-containing precursor into a remote plasma region fluidly coupled to a substrate processing region via through-holes in a showerhead. The methods further include forming a remote plasma in the remote plasma region to produce plasma effluents from the fluorine-containing precursor and the hydrogen-containing precursor. The methods further include etching the silicon from a substrate disposed within the substrate processing region by flowing the plasma effluents into the substrate processing region through the through-holes in the showerhead.

Embodiments include methods of etching silicon. The methods include flowing a fluorine-containing precursor and a hydrogen-containing precursor into a remote plasma region fluidly coupled to a substrate processing region via through-holes in a showerhead. Flowing the fluorine-containing precursor and the ammonia includes maintaining an atomic flow rate (H:F) greater than 2:1. The methods further include forming a remote plasma in the remote plasma region to produce plasma effluents from the fluorine-containing precursor and the hydrogen-containing precursor. The methods further include etching the silicon from a substrate disposed within the substrate processing region by flowing the plasma effluents into the substrate processing region through the through-holes in the showerhead. Etching the silicon includes forming pyramidal pits into the substrate.

Embodiments include methods of etching a semiconducting layer. The methods include transferring a patterned substrate into a substrate processing region, wherein the patterned substrate comprises regions of $Si_{(1-X)}Ge_X$ having nonzero X. The methods further include flowing ammonia ($NH_3$) and nitrogen trifluoride ($NF_3$) into a remote plasma region fluidly coupled to a substrate processing region via through-holes in a showerhead. The methods further include forming a remote plasma in the remote plasma region to produce plasma effluents from the nitrogen trifluoride.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods of selectively etching silicon relative to silicon germanium are described. The methods include a remote plasma etch using plasma effluents formed from a fluorine-containing precursor and a hydrogen-containing precursor. Plasma effluents from the remote plasma are flowed into a substrate processing region where the plasma effluents react with the silicon. The plasmas effluents react with exposed surfaces and selectively remove silicon while very slowly removing other exposed materials. The methods are useful for removing $Si_{(1-X)}Ge_X$ faster than $Si_{(1-Y)}Ge_Y$, for X<Y. In some embodiments, the silicon germanium etch selectivity results partly from the presence of an ion suppression element positioned between the remote plasma and the substrate processing region.

Figure 1:
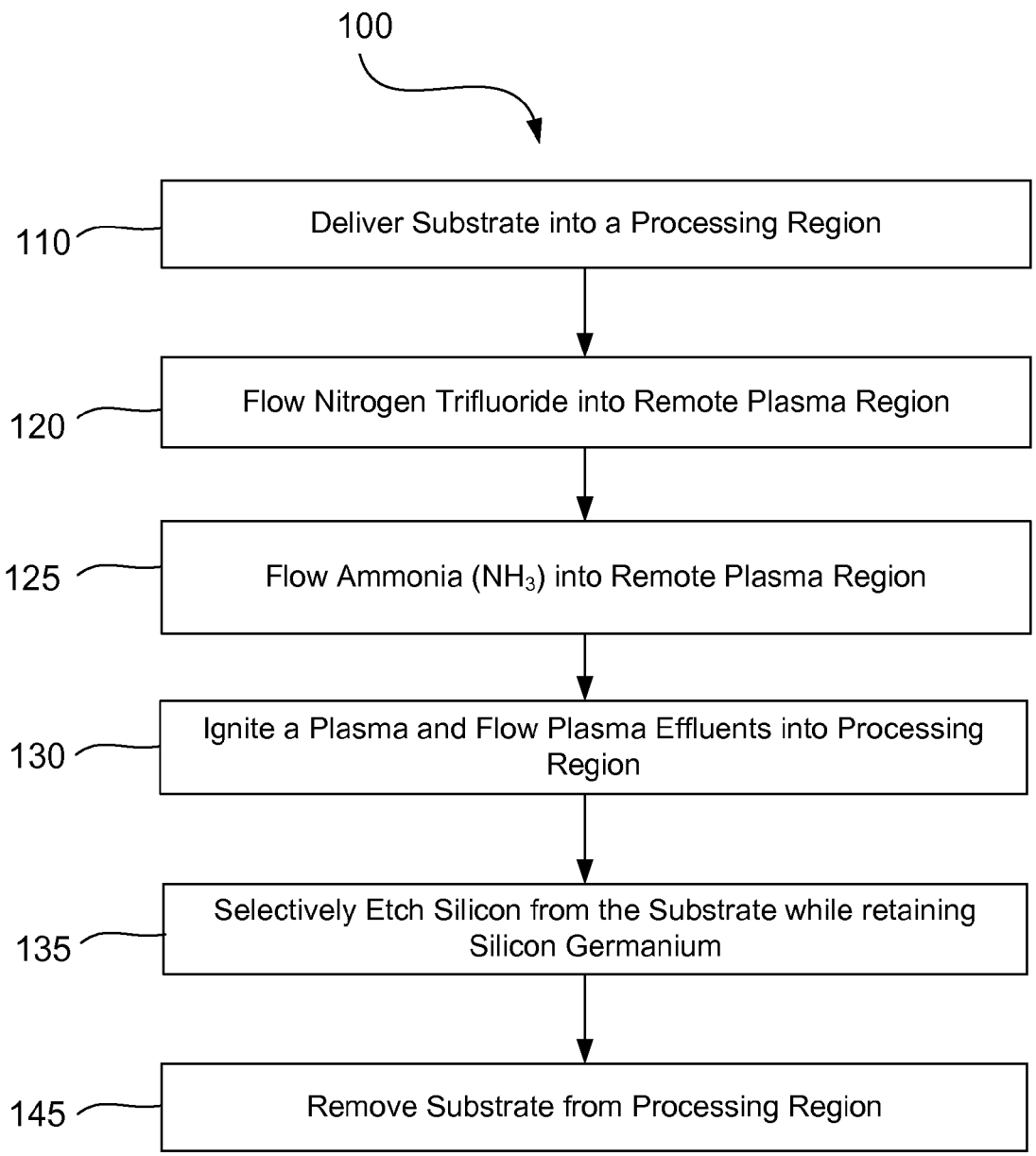
FIG. 1 is a flow chart of a silicon selective etch process according to embodiments.

In order to better understand and appreciate the invention, reference is now made to FIG. 1 which is a flow chart of a silicon selective etch process 100 according to embodiments. Prior to the first operation, silicon is formed on a substrate. The silicon is present on the surface of the substrate prior to the first operation of silicon selective etch process 100 and may be in the form of exposed discrete portions of a patterned substrate surface. The silicon may be single crystal silicon. The substrate is delivered into a processing region (operation 110).

A flow of nitrogen trifluoride is introduced into a plasma region separate from the processing region (operation 120). Other sources of fluorine may be used to augment or replace the nitrogen trifluoride. In general, a fluorine-containing precursor may be flowed into the plasma region and the fluorine-containing precursor includes at least one precursor selected from the group consisting of a fluorocarbon, atomic fluorine, diatomic fluorine, an interhalogen fluoride (e.g. bromine trifluoride, chlorine trifluoride), nitrogen trifluoride, hydrogen fluoride, sulfur hexafluoride and xenon difluoride. The fluorine-containing precursor may be devoid of hydrogen. Ammonia ($NH_3$) is also flowed into the plasma region (operation 125) where it is simultaneously excited in a plasma along with the nitrogen trifluoride. In general, a hydrogen-containing precursor may be flowed into the remote plasma region and the hydrogen-containing precursor comprises one or more of ammonia, hydrogen ($H_2$), or a hydrocarbon. In a preferred embodiment, ammonia is used as the source of hydrogen to facilitate the breaking of bonds and formation of neutral radical-hydrogen species (H*). The flow rate of the hydrogen-containing precursor may be greater than the flow rate of the fluorine-containing precursor by a multiplicative factor of two, in embodiments, to increase the etch selectivity of silicon. Specific value ranges for the flow rates will be discussed shortly.

The separate plasma region may be referred to as a remote plasma region for all etch processes described herein and may be within a distinct module from the processing chamber or a compartment within the processing chamber. The separate plasma region may is fluidly coupled to the substrate processing region by through-holes in a showerhead disposed between the two regions. The hardware just described may also be used in all processes discussed herein.

The remote plasma region may be a capacitively-coupled plasma region, in embodiments, and may be disposed remote from the substrate processing region of the processing chamber. For example, the capacitively-coupled plasma region (and the remote plasma region in general) may be separated from the substrate processing region by the showerhead.

The plasma effluents formed in the remote plasma region are then flowed into the substrate processing region (operation 130). Silicon on the substrate is selectively etched (operation 135) such that silicon may be removed more rapidly than other exposed materials. The selective etch in all examples disclosed herein may etch silicon significantly faster than silicon germanium of a variety of stoichiometries in embodiments. Etch process 100 may involve maintenance of an atomic flow ratio of hydrogen (H) to fluorine (F) in order achieve high etch selectivity of silicon. The atomic flow ratio (H:F) may be greater than 2:1 or, more preferably greater than 4:1 according to embodiments. Silicon selective etch process 100 is highly selective of silicon over silicon germanium as long as the hydrogen-containing precursor to fluorine-containing precursor flow rate ratio is maintained as outlined herein. The reactive chemical species and any process effluents are removed from the substrate processing region and then the substrate is removed from the processing region (operation 145).

The plasma effluents react with the silicon to selectively remove the silicon. The plasma effluents are thought to contain neutral fluorine radicals (denoted F*) as well as neutral hydrogen radicals (H*) and the combination may preferentially react with portions of exposed silicon relative to portions of exposed silicon germanium for example. The concurrent flow of neutral hydrogen radicals is conjectured to preferentially remove adsorbed fluorine from silicon germanium relative to the adsorbed fluorine on the silicon. This enables the fluorine to continue etching the silicon but impedes the etching action on the silicon germanium according to embodiments.

The patterned substrate further includes one or more exposed portions of silicon germanium. The etch selectivity (e.g. etch silicon:silicon germanium) of all processes taught herein may be greater than or about 10:1, greater than or about 20:1, greater than or about 50:1, or greater than or about 100:1 according to embodiments. These high etch selectivities are achievable because the neutral hydrogen preferentially interferes with the etching action of the neutral fluorine radicals on the exposed silicon germanium portions.

In each remote plasma described herein, the flows of the precursors into the remote plasma region may further include one or more relatively inert gases such as He, $N_2$, Ar. The inert gas can be used to improve plasma stability, ease plasma initiation, and improve process uniformity. Argon is helpful, as an additive, to promote the formation of a stable plasma. Process uniformity is generally increased when helium is included. These additives are present in embodiments throughout this specification. Flow rates and ratios of the different gases may be used to control etch rates and etch selectivity.

A presence of oxygen may damage the exposed front end regions of material whose integrity is needed to form working devices for all etch processes described herein by oxidizing the silicon, germanium and/or silicon germanium domains. As such, the flow precursors into the remote plasma region may be essentially devoid of oxygen (e.g. no $O_2$) according to embodiments. Similarly, the remote plasma region and the substrate processing region may be essentially devoid of oxygen during the etching operations described herein.

In embodiments, the fluorine-containing precursor (e.g. $NF_3$) is supplied at a flow rate of between about 5 sccm (standard cubic centimeters per minute) and 500 sccm, $NH_3$ at a flow rate of between about 20 sccm and 2,000 sccm, He at a flow rate of between about 0.1 slm (standard liters per minute) and 10 slm, and Ar at a flow rate of between about 0.1 slm and 3 slm. Generally speaking, the fluorine-containing precursor may be supplied at a flow rate between about 5 sccm and about 500 sccm, between about 10 sccm and about 300 sccm, preferably between about 25 sccm and about 250 sccm or more preferably between about 100 sccm and about 200 sccm according to embodiments. The hydrogen-containing precursor (e.g. ammonia) may be supplied at a flow rate between about 20 sccm and about 2,000 sccm, between about 30 sccm and about 1,500 sccm, preferably between about 50 sccm and about 1,200 sccm or more preferably between about 200 sccm and about 1,000 sccm in embodiments.

Silicon selective etch process 100 (and the other etch processes described herein) includes applying energy to the fluorine-containing precursor and the hydrogen-containing precursor while they flow through the remote plasma region to generate the plasma effluents. The plasma may be generated using known techniques (e.g., radio frequency excitations, capacitively-coupled power, and inductively-coupled power). In an embodiment, the energy is applied using a capacitively-coupled plasma unit. The remote plasma source power may be between about 10 watts and about 5,000 watts, between about 30 watts and about 7,500 watts, between about 100 watts and about 5,000 watts, or between about 300 watts and about 3,000 watts according to embodiments. The selectivity is increased by increasing remote plasma power. In preferred embodiments, the remote plasma source power may be greater than 500 watts or greater than 1000 watts according to embodiments.

The pressure in the substrate processing region is about the same as the pressure in the substrate processing region, according to embodiments, in all silicon selective etch processes described herein. The pressure in the remote plasma region and also in the substrate processing region is between about 0.1 Torr and about 50 Torr, between about 0.5 Torr and about 20 Torr, preferably between about 1 Torr and about 10 Torr or more preferably between about 2.5 Torr and about 5 Torr in embodiments.

The temperature of the substrate during etch processes described herein may be between about 30° C. and about 300° C. in general. In embodiments, the temperature of the patterned substrate during the selective silicon germanium etches described herein may be between about 30° C. and about 300° C., between about 50° C. and about 260° C., preferably between about 120° C. and about 200° C., and more preferably between about 140° C. and about 190° C. The etch selectivity drops off at the high and low ends of these embodiments.

Figure 2:
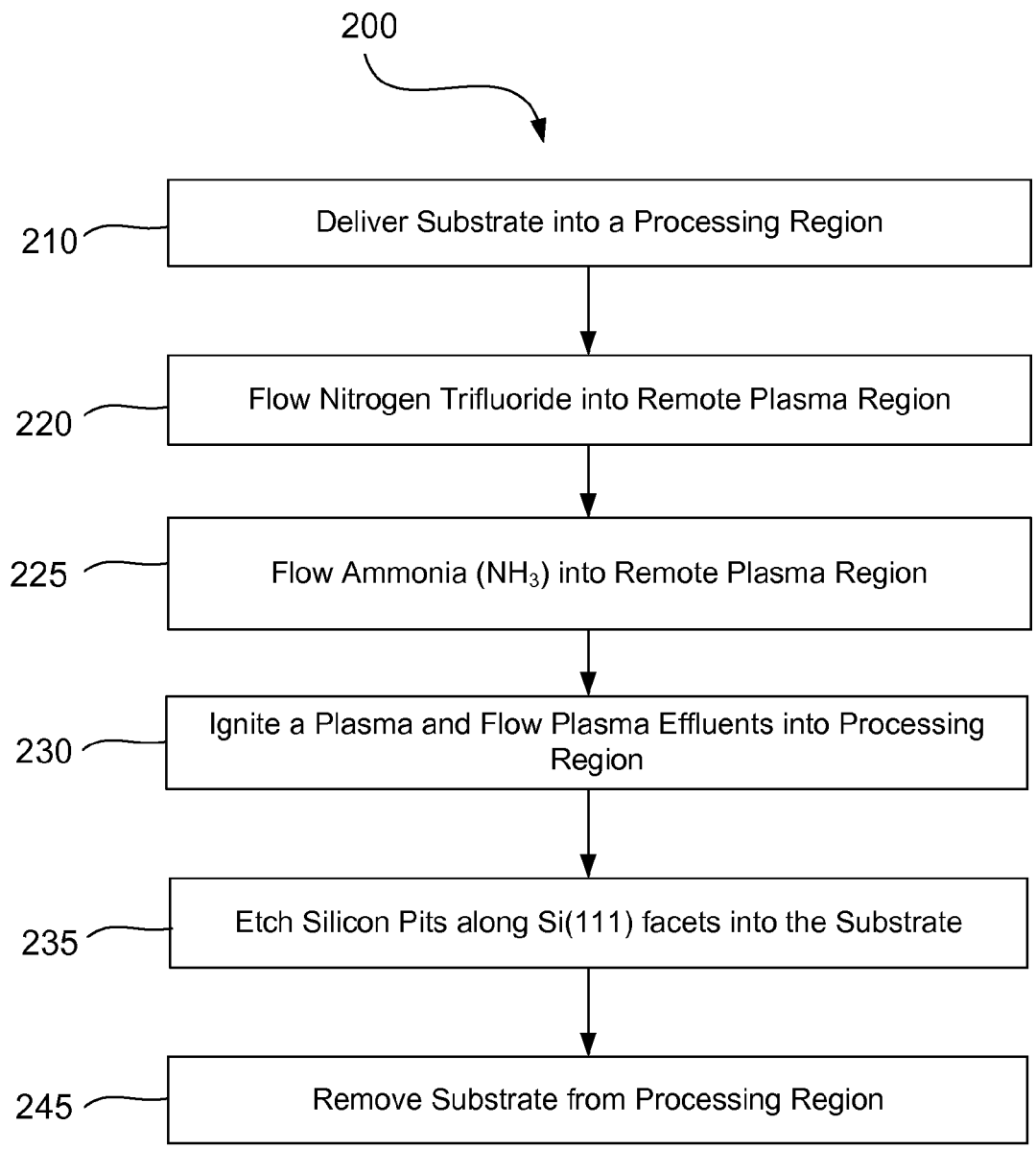
FIG. 2 is a flow chart of a crystallographic silicon etch process according to embodiments.

In order to appreciate another aspect of the invention, reference is now made to FIG. 2 which is a flow chart of a silicon etch process 200 according to embodiments. The various traits and process parameters discussed with reference to FIG. 1 may not be repeated here except when deviations of specific traits and process parameters are observed. Prior to the first operation, exposed silicon is formed or already present on a substrate. The substrate is then delivered into a processing region (operation 210).

Flows of a fluorine-containing precursor and a hydrogen-containing precursor are introduced into the remote plasma region (operations 220 and 225 respectively). The fluorine-containing precursor may include one or more of a fluorocarbon, atomic fluorine, diatomic fluorine, an interhalogen fluoride (e.g. bromine trifluoride, chlorine trifluoride), nitrogen trifluoride, hydrogen fluoride, sulfur hexafluoride and xenon difluoride. The hydrogen-containing precursor may include one or more of ammonia, hydrogen ($H_2$), or a hydrocarbon. Ammonia is used as the hydrogen-containing precursor, in a preferred embodiment, to facilitate the formation of neutral radical-hydrogen species. The flow rate of the hydrogen-containing precursor may be greater than the flow rate of the fluorine-containing precursor by a multiplicative factor of two, in embodiments, to increase the etch selectivity of silicon.

The plasma effluents are formed in the remote plasma region and flowed into the substrate processing region (operation 230). Silicon on the substrate is etched (operation 235) such that specific crystallographic planes (namely Si(111)) are formed on the surface. The surface of the substrate may be coplanar with the Si(100) crystal plane, in which case pits may be etched into the substrate. The pits may be in the shape of pyramids. Alternatively, or in combination, raised pyramids may be formed on the surface of the substrate. The pits and/or bumps formed in this manner may each display Si(111) facets. This may occur because the Si(111) facet of silicon etches considerably more slowly, e.g. over 10×, 20× or 30× more slowly than the Si(100) facet in embodiments. The silicon etch 200 may be referred to as a crystallographic etch herein. Following removal of silicon, the reactive chemical species and any process effluents are removed from the substrate processing region and then the substrate is removed from the processing region (operation 245).

Crystallographic etch process 200 may involve maintenance of an atomic flow ratio of hydrogen (H) to fluorine (F) in order achieve high etch selectivity of silicon. The atomic flow ratio (H:F) may be greater than 2:1 or, more preferably greater than 4:1 according to embodiments. Flow rates of the fluorine-containing precursor (e.g. $NF_3$) and the hydrogen-containing precursor (e.g. $NH_3$) are the same as those provided earlier according to embodiments. Similarly, the flow rates of helium and argon may fall within the embodiments provided during the discussion of FIG. 1. The remote plasma power, pressures in the remote plasma region and substrate processing region, and the substrate temperatures during crystallographic etch process 200 may also be within the ranges provided with reference to FIG. 1.

Generally speaking, $Si_{(1-X)}Ge_X$ may be etched faster than $Si_{(1-Y)}Ge_Y$ for all X<Y. $Si_{(1-X)}Ge_X$ may etch at a first etch rate whereas $Si_{(1-Y)}Ge_Y$ may etch at a second etch rate. The first etch rate may be greater than the second etch rate according to embodiments. The first etch rate may exceed the second etch rate by a multiplicative factor of ten, twenty, fifty or one hundred in embodiments. Y may exceed X by two tenths, three tenths, four tenths, one half or seven tenths according to embodiments. The example in FIG. 1 includes selectively etching $Si_{(1-X)}Ge_X$ relative to $Si_{(1-Y)}Ge_Y$ with X=1 and 1≥X>0. The example of FIG. 2 includes crystallographically etching $Si_{(1-X)}Ge_X$ with X between 0 and 1, inclusive.

In embodiments, an ion suppressor as described in the exemplary equipment section may be used to provide radical and/or neutral species for selectively etching substrates. The ion suppressor may also be referred to as an ion suppression element. In embodiments, for example, the ion suppressor is used to filter fluorine and hydrogen containing plasma effluents to selectively etch silicon. The ion suppressor may be included in each exemplary process described herein. Using the plasma effluents, an etch rate selectivity of silicon to a wide variety of materials may be achieved.

The ion suppressor may be used to provide a reactive gas having a higher concentration of radicals than ions. The ion suppressor functions to dramatically reduce or substantially eliminate ionically charged species traveling from the plasma generation region to the substrate. The electron temperature may be measured using a Langmuir probe in the substrate processing region during excitation of a plasma in the remote plasma region on the other side of the ion suppressor. In embodiments, the electron temperature may be less than 0.5 eV, less than 0.45 eV, less than 0.4 eV, or preferably less than 0.35 eV. These extremely low values for the electron temperature are enabled by the presence of the showerhead and/or the ion suppressor positioned between the substrate processing region and the remote plasma region. Uncharged neutral and radical species may pass through the openings in the ion suppressor to react at the substrate. Because most of the charged particles of a plasma are filtered or removed by the ion suppressor, the substrate is not necessarily biased during the etch process. Such a process using radicals and other neutral species can reduce plasma damage compared to conventional plasma etch processes that include sputtering and bombardment. The ion suppressor helps control the concentration of ionic species in the reaction region at a level that assists the process. Embodiments of the present invention are also advantageous over conventional wet etch processes where surface tension of liquids can cause bending and peeling of small features.

Generally speaking, the processes described herein may be used to retain films which contain silicon and germanium (and not just any specific example of stoichiometric silicon germanium) relative to silicon. The silicon selective etch processes may retain exposed silicon germanium which includes an atomic concentration of about 28% or more silicon and about 70% or more germanium according to embodiments. The silicon germanium may consist only of silicon and germanium, allowing for small dopant concentrations and other undesirable or desirable minority additives. Silicon germanium may have an atomic silicon percentage greater than 28%, 35%, 45%, 55% or 65% in embodiments. For example, the atomic silicon percentage may be between about 28% and about 70%. The balance of the silicon germanium may be germanium. Silicon germanium may have an atomic germanium percentage greater than 28%, 35%, 45%, 55% or 65% in embodiments. For example, the atomic germanium percentage may be between about 28% and about 70%. In these cases, the balance may be silicon according to embodiments.

Additional process parameters are disclosed in the course of describing an exemplary processing chamber and system.

Exemplary Processing System

Processing chambers that may implement embodiments of the present invention may be included within processing platforms such as the CENTURA® and PRODUCER® systems, available from Applied Materials, Inc. of Santa Clara, Calif.

Figure 3A:
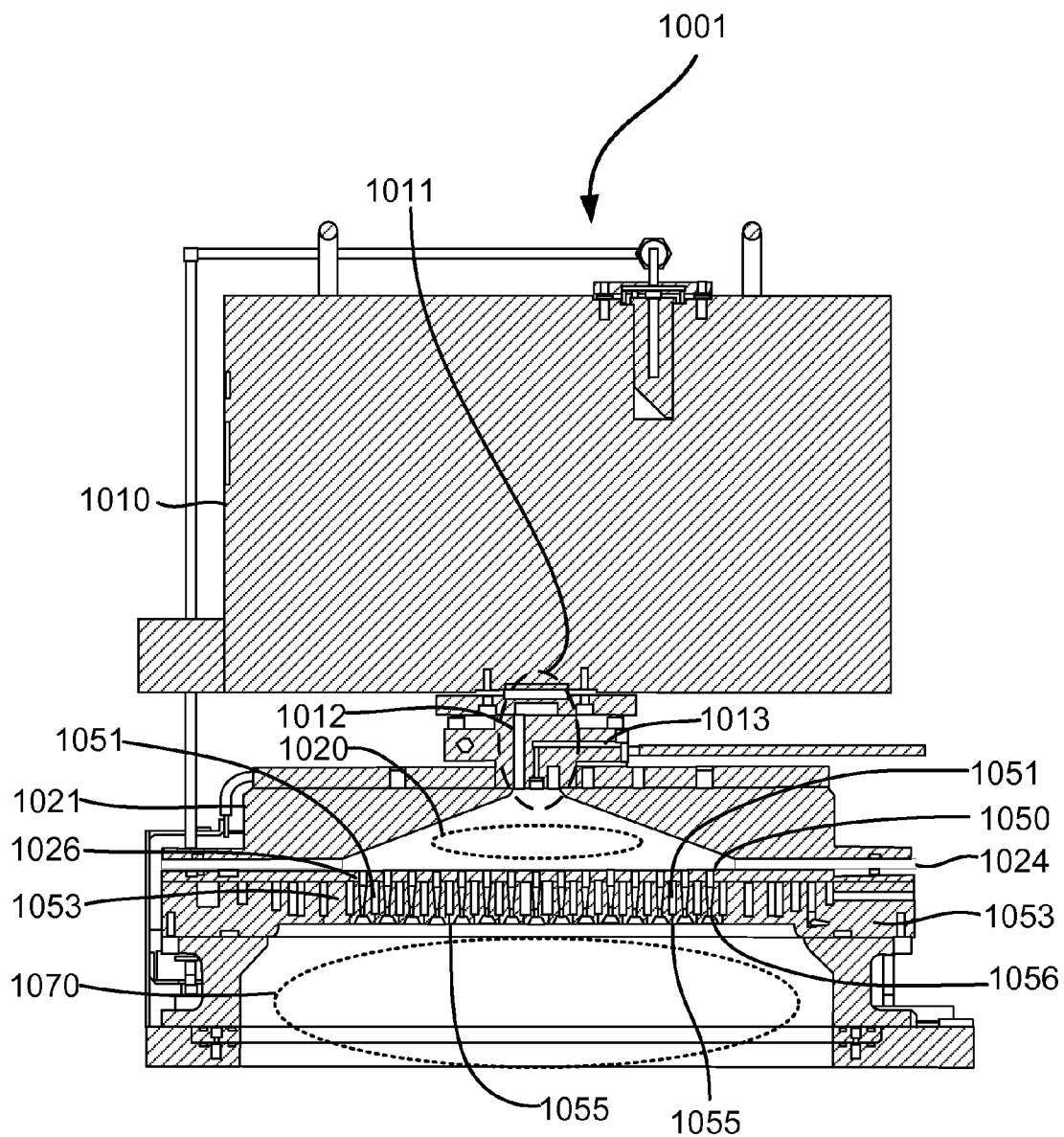
FIG. 3A shows a substrate processing chamber according to embodiments.

FIG. 3A is a substrate processing chamber 1001 according to embodiments. A remote plasma system 1010 may process a fluorine-containing precursor and/or a hydrogen-containing precursor which then travels through a gas inlet assembly 1011. Two distinct gas supply channels are visible within the gas inlet assembly 1011. A first channel 1012 carries a gas that passes through the remote plasma system 1010 (RPS), while a second channel 1013 bypasses the remote plasma system 1010. Either channel may be used for the fluorine-containing precursor, in embodiments. On the other hand, the first channel 1012 may be used for the process gas and the second channel 1013 may be used for a treatment gas. The lid (or conductive top portion) 1021 and a perforated partition 1053 are shown with an insulating ring 1024 in between, which allows an AC potential to be applied to the lid 1021 relative to perforated partition 1053. The AC potential strikes a plasma in chamber plasma region 1020. The process gas may travel through first channel 1012 into chamber plasma region 1020 and may be excited by a plasma in chamber plasma region 1020 alone or in combination with remote plasma system 1010. If the process gas (e.g. the fluorine-containing precursor) flows through second channel 1013, then only the chamber plasma region 1020 is used for excitation. The combination of chamber plasma region 1020 and/or remote plasma system 1010 may be referred to as a remote plasma system herein. The perforated partition (also referred to as a showerhead) 1053 separates chamber plasma region 1020 from a substrate processing region 1070 beneath showerhead 1053. Showerhead 1053 allows a plasma present in chamber plasma region 1020 to avoid directly exciting gases in substrate processing region 1070, while still allowing excited species to travel from chamber plasma region 1020 into substrate processing region 1070.

Showerhead 1053 is positioned between chamber plasma region 1020 and substrate processing region 1070 and allows plasma effluents (excited derivatives of precursors or other gases) created within remote plasma system 1010 and/or chamber plasma region 1020 to pass through a plurality of through-holes 1056 that traverse the thickness of the plate. The showerhead 1053 also has one or more hollow volumes 1051 which can be filled with a precursor in the form of a vapor or gas (such as a fluorine-containing precursor) and pass through small holes 1055 into substrate processing region 1070 but not directly into chamber plasma region 1020. Showerhead 1053 is thicker than the length of the smallest diameter 1050 of the through-holes 1056 in this embodiment. The length 1026 of the smallest diameter 1050 of the through-holes may be restricted by forming larger diameter portions of through-holes 1056 part way through the showerhead 1053 to maintain a significant concentration of excited species penetrating from chamber plasma region 1020 to substrate processing region 1070. The length of the smallest diameter 1050 of the through-holes 1056 may be the same order of magnitude as the smallest diameter of the through-holes 1056 or less in embodiments.

Showerhead 1053 may be configured to serve the purpose of an ion suppressor as shown in FIG. 3A. Alternatively, a separate processing chamber element may be included (not shown) which suppresses the ion concentration traveling into substrate processing region 1070. Lid 1021 and showerhead 1053 may function as a first electrode and second electrode, respectively, so that lid 1021 and showerhead 1053 may receive different electric voltages. In these configurations, electrical power (e.g., RF power) may be applied to lid 1021, showerhead 1053, or both. For example, electrical power may be applied to lid 1021 while showerhead 1053 (serving as ion suppressor) is grounded. The substrate processing system may include a RF generator that provides electrical power to the lid and/or showerhead 1053. The voltage applied to lid 1021 may facilitate a uniform distribution of plasma (i.e., reduce localized plasma) within chamber plasma region 1020. To enable the formation of a plasma in chamber plasma region 1020, insulating ring 1024 may electrically insulate lid 1021 from showerhead 1053.

Insulating ring 1024 may be made from a ceramic and may have a high breakdown voltage to avoid sparking. Portions of substrate processing chamber 1001 near the capacitively-coupled plasma components just described may further include a cooling unit (not shown) that includes one or more cooling fluid channels to cool surfaces exposed to the plasma with a circulating coolant (e.g., water).

In the embodiment shown, showerhead 1053 may distribute (via through-holes 1056) process gases which contain fluorine, hydrogen and/or plasma effluents of such process gases upon excitation by a plasma in chamber plasma region 1020. In embodiments, the process gas introduced into the remote plasma system 1010 and/or chamber plasma region 1020 may contain fluorine (e.g. $F_2$, $NF_3$ or $XeF_2$). The process gas may also include a carrier gas such as helium, argon, nitrogen ($N_2$), etc. Plasma effluents may include ionized or neutral derivatives of the process gas and may also be referred to herein as radical-fluorine and/or radical-hydrogen referring to the atomic constituent of the process gas introduced.

Through-holes 1056 are configured to suppress the migration of ionically-charged species out of the chamber plasma region 1020 while allowing uncharged neutral or radical species to pass through showerhead 1053 into substrate processing region 1070. These uncharged species may include highly reactive species that are transported with less-reactive carrier gas by through-holes 1056. As noted above, the migration of ionic species by through-holes 1056 may be reduced, and in some instances completely suppressed. Controlling the amount of ionic species passing through showerhead 1053 provides increased control over the gas mixture brought into contact with the underlying wafer substrate, which in turn increases control of the deposition and/or etch characteristics of the gas mixture. For example, adjustments in the ion concentration of the gas mixture can alter the etch selectivity (e.g., the silicon:silicon germanium etch ratio).

In embodiments, the number of through-holes 1056 may be between about 60 and about 2000. Through-holes 1056 may have a variety of shapes but are most easily made round. The smallest diameter 1050 of through-holes 1056 may be between about 0.5 mm and about 20 mm or between about 1 mm and about 6 mm in embodiments. There is also latitude in choosing the cross-sectional shape of through-holes, which may be made conical, cylindrical or combinations of the two shapes. The number of small holes 1055 used to introduce unexcited precursors into substrate processing region 1070 may be between about 100 and about 5000 or between about 500 and about 2000 in different embodiments. The diameter of the small holes 1055 may be between about 0.1 mm and about 2 mm.

Through-holes 1056 may be configured to control the passage of the plasma-activated gas (i.e., the ionic, radical, and/or neutral species) through showerhead 1053. For example, the aspect ratio of the holes (i.e., the hole diameter to length) and/or the geometry of the holes may be controlled so that the flow of ionically-charged species in the activated gas passing through showerhead 1053 is reduced. Through-holes 1056 in showerhead 1053 may include a tapered portion that faces chamber plasma region 1020, and a cylindrical portion that faces substrate processing region 1070. The cylindrical portion may be proportioned and dimensioned to control the flow of ionic species passing into substrate processing region 1070. An adjustable electrical bias may also be applied to showerhead 1053 as an additional means to control the flow of ionic species through showerhead 1053.

Alternatively, through-holes 1056 may have a smaller inner diameter (ID) toward the top surface of showerhead 1053 and a larger ID toward the bottom surface. In addition, the bottom edge of through-holes 1056 may be chamfered to help evenly distribute the plasma effluents in substrate processing region 1070 as the plasma effluents exit the showerhead and promote even distribution of the plasma effluents and precursor gases. The smaller ID may be placed at a variety of locations along through-holes 1056 and still allow showerhead 1053 to reduce the ion density within substrate processing region 1070. The reduction in ion density results from an increase in the number of collisions with walls prior to entry into substrate processing region 1070. Each collision increases the probability that an ion is neutralized by the acquisition or loss of an electron from the wall. Generally speaking, the smaller ID of through-holes 1056 may be between about 0.2 mm and about 20 mm. In other embodiments, the smaller ID may be between about 1 mm and 6 mm or between about 0.2 mm and about 5 mm. Further, aspect ratios of the through-holes 1056 (i.e., the smaller ID to hole length) may be approximately 1 to 20. The smaller ID of the through-holes may be the minimum ID found along the length of the through-holes. The cross sectional shape of through-holes 1056 may be generally cylindrical, conical, or any combination thereof.

Figure 3B:
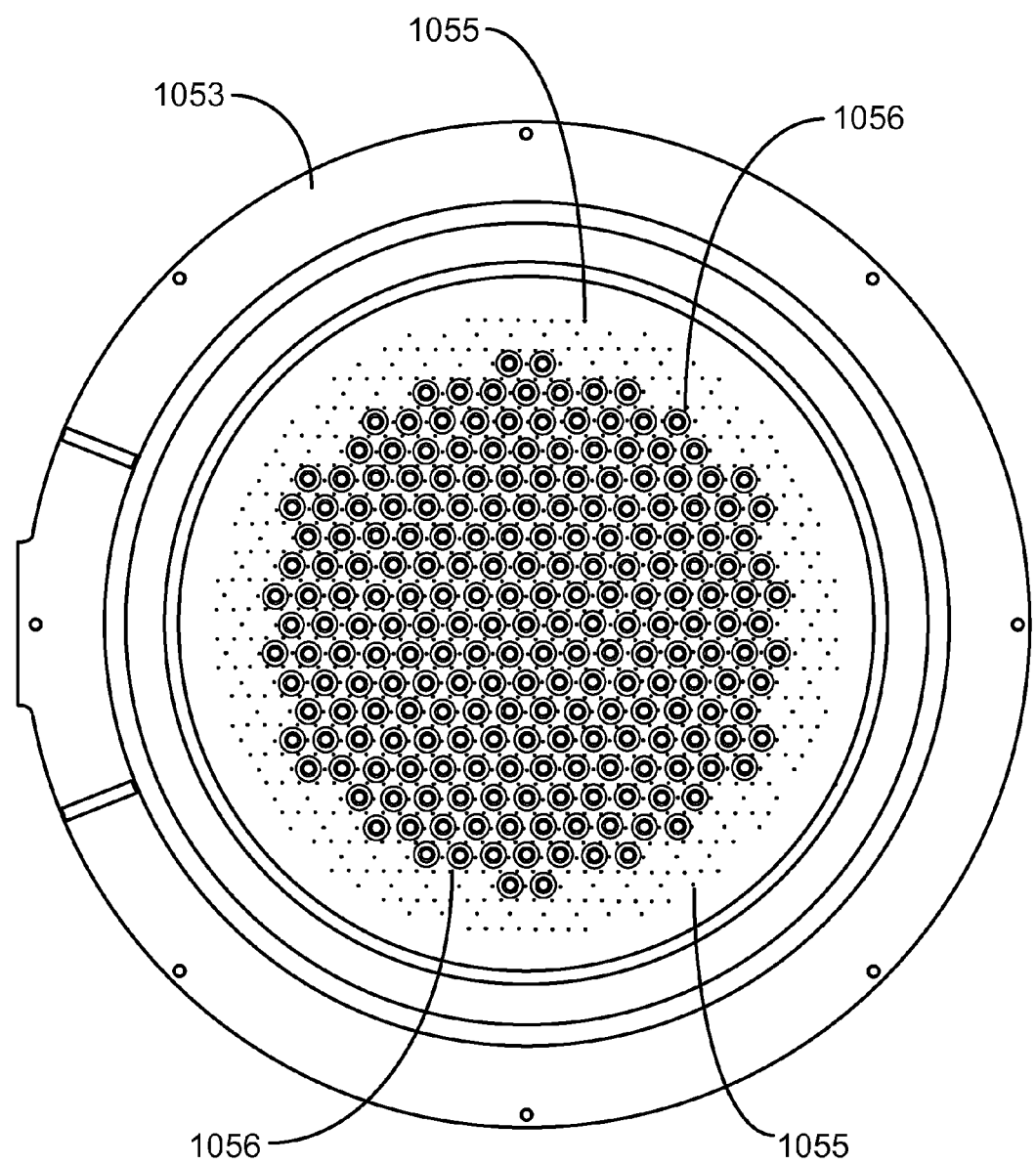
FIG. 3B shows a showerhead of a substrate processing chamber according to embodiments.

FIG. 3B is a bottom view of a showerhead 1053 for use with a processing chamber according to embodiments. Showerhead 1053 corresponds with the showerhead shown in FIG. 3A. Through-holes 1056 are depicted with a larger inner-diameter (ID) on the bottom of showerhead 1053 and a smaller ID at the top. Small holes 1055 are distributed substantially evenly over the surface of the showerhead, even amongst the through-holes 1056 which helps to provide more even mixing than other embodiments described herein.

An exemplary patterned substrate may be supported by a pedestal (not shown) within substrate processing region 1070 when fluorine-containing plasma effluents and hydrogen-containing plasma effluents arrive through through-holes 1056 in showerhead 1053. Though substrate processing region 1070 may be equipped to support a plasma for other processes such as curing, no plasma is present during the etching of patterned substrate according to embodiments.

A plasma may be ignited either in chamber plasma region 1020 above showerhead 1053 or substrate processing region 1070 below showerhead 1053. A plasma is present in chamber plasma region 1020 to produce the radical-fluorine from an inflow of the fluorine-containing precursor. An AC voltage typically in the radio frequency (RF) range is applied between the conductive top portion (lid 1021) of the processing chamber and showerhead 1053 to ignite a plasma in chamber plasma region 1020 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 1070 is turned on to either cure a film or clean the interior surfaces bordering substrate processing region 1070. A plasma in substrate processing region 1070 is ignited by applying an AC voltage between showerhead 1053 and the pedestal or bottom of the chamber. A cleaning gas may be introduced into substrate processing region 1070 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The chamber plasma region or a region in a remote plasma system may be referred to as a remote plasma region. In embodiments, the radical precursors (e.g. radical-fluorine and/or radical-hydrogen) are formed in the remote plasma region and travel into the substrate processing region where the combination preferentially etches silicon. Plasma power may essentially be applied only to the remote plasma region, in embodiments, to ensure that the radical-fluorine and/or the radical-hydrogen (which together may be referred to as plasma effluents) are not further excited in the substrate processing region.

In embodiments employing a chamber plasma region, the excited plasma effluents are generated in a section of the substrate processing chamber partitioned from the substrate processing region. The substrate processing region, is where the plasma effluents mix and react to etch the patterned substrate (e.g., a semiconductor wafer). The excited plasma effluents may also be accompanied by inert gases (in the exemplary case, argon). The substrate processing region may be described herein as "plasma-free" during etching of the substrate. "Plasma-free" does not necessarily mean the region is devoid of plasma. A relatively low concentration of ionized species and free electrons created within the plasma region do travel through pores (apertures) in the partition (showerhead/ion suppressor) due to the shapes and sizes of through-holes 1056. In some embodiments, there is essentially no concentration of ionized species and free electrons within the substrate processing region. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film. All causes for a plasma having much lower intensity ion density than the chamber plasma region (or a remote plasma region, for that matter) during the creation of the excited plasma effluents do not deviate from the scope of "plasma-free" as used herein.

The fluorine-containing precursor may be supplied at a flow rate between about 5 sccm and about 500 sccm, between about 10 sccm and about 300 sccm, preferably between about 25 sccm and about 250 sccm or more preferably between about 100 sccm and about 200 sccm according to embodiments. The hydrogen-containing precursor (e.g. ammonia) may be supplied at a flow rate between about 20 sccm and about 2,000 sccm, between about 30 sccm and about 1,500 sccm, preferably between about 50 sccm and about 1,200 sccm or more preferably between about 200 sccm and about 1,000 sccm in embodiments Combined flow rates of fluorine-containing precursor and hydrogen-containing precursor into the chamber may account for 0.05% to about 20% by volume of the overall gas mixture; the remainder being carrier gases. The fluorine-containing precursor and the hydrogen-containing precursor are flowed into the remote plasma region but the plasma effluents have the same volumetric flow ratio, in embodiments. In the case of the fluorine-containing precursor, a purge or carrier gas may be first initiated into the remote plasma region before those of the fluorine-containing gas to stabilize the pressure within the remote plasma region.

Plasma power applied to the remote plasma region can be a variety of frequencies or a combination of multiple frequencies. In the exemplary processing system the plasma is provided by RF power delivered between lid 1021 and showerhead 1053. In an embodiment, the energy is applied using a capacitively-coupled plasma unit. When using a Frontier™ or similar system, the remote plasma source power may be between about 100 watts and about 3000 watts, between about 200 watts and about 2500 watts, between about 300 watts and about 2000 watts, or between about 500 watts and about 1500 watts in embodiments. The RF frequency applied in the exemplary processing system may be low RF frequencies less than about 200 kHz, high RF frequencies between about 10 MHz and about 15 MHz or microwave frequencies greater than or about 1 GHz according to embodiments.

Substrate processing region 1070 can be maintained at a variety of pressures during the flow of carrier gases and plasma effluents into substrate processing region 1070. The pressure within the substrate processing region is below or about 50 Torr, below or about 30 Torr, below or about 20 Torr, below or about 10 Torr or below or about 5 Torr in embodiments. The pressure may be above or about 0.1 Torr, above or about 0.2 Torr, above or about 0.5 Torr or above or about 1 Torr according to embodiments. Lower limits on the pressure may be combined with upper limits on the pressure in embodiments.

In one or more embodiments, the substrate processing chamber 1001 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum. Processing chambers that may implement embodiments of the present invention may include dielectric etch chambers or a variety of chemical vapor deposition chambers, among other types of chambers.

Figure 4:
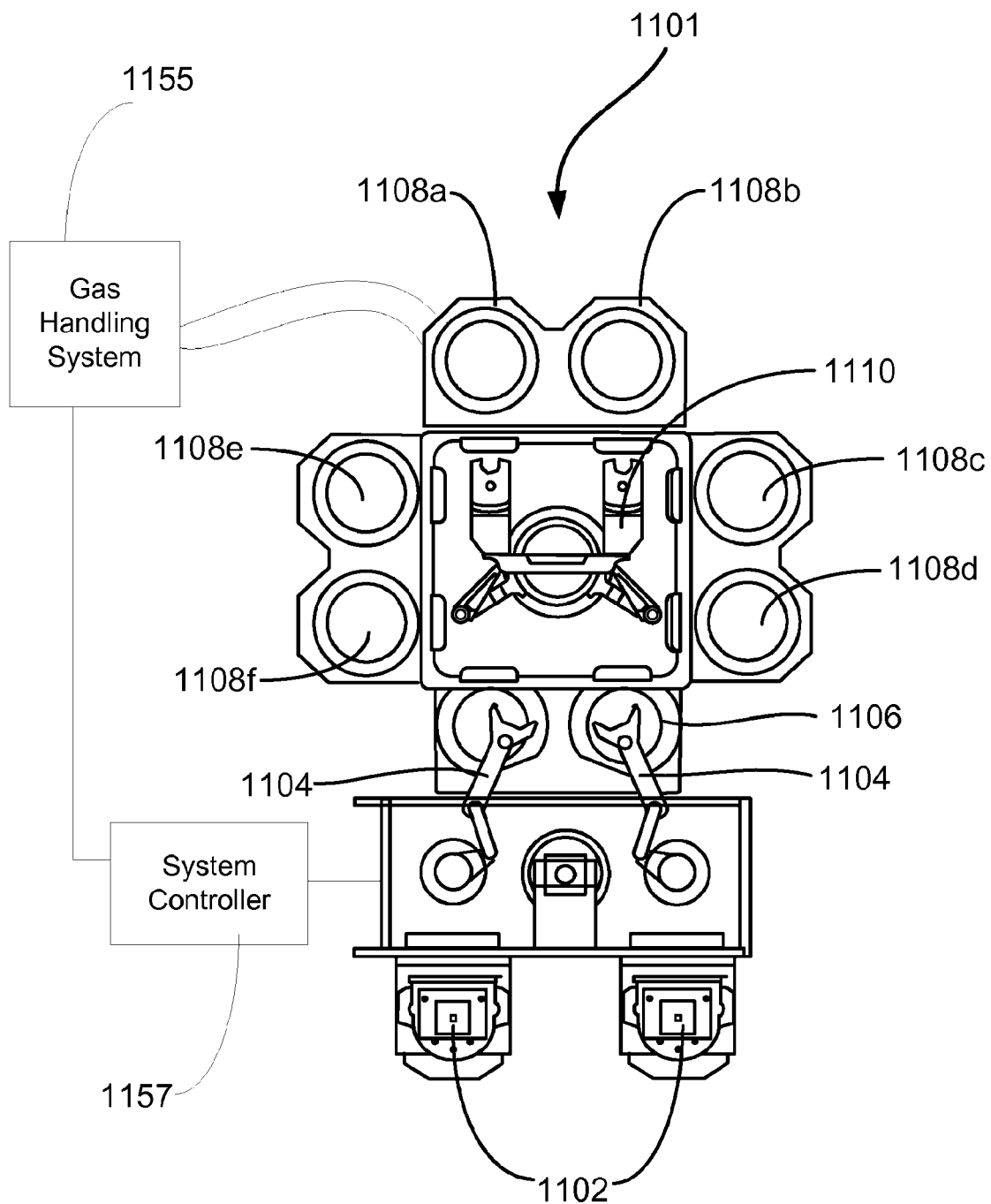
FIG. 4 shows a substrate processing system according to embodiments.

Embodiments of the deposition systems may be incorporated into larger fabrication systems for producing integrated circuit chips. FIG. 4 shows one such system 1101 of deposition, baking and curing chambers according to embodiments. In the figure, a pair of FOUPs (front opening unified pods) 1102 supply substrate substrates (e.g., 300 mm diameter wafers) that are received by robotic arms 1104 and placed into a low pressure holding areas 1106 before being placed into one of the wafer processing chambers 1108a-f. A second robotic arm 1110 may be used to transport the substrate wafers from the low pressure holding areas 1106 to the wafer processing chambers 1108a-f and back. Each wafer processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The wafer processing chambers 1108a-f may include one or more system components for depositing, annealing, curing and/or etching a flowable dielectric film on the substrate wafer. In one configuration, two pairs of the processing chamber (e.g., 1108c-d and 1108e-f) may be used to deposit dielectric material on the substrate, and the third pair of processing chambers (e.g., 1108a-b) may be used to etch the deposited dielectric. In another configuration, all three pairs of chambers (e.g., 1108a-f) may be configured to etch a dielectric film on the substrate. Any one or more of the processes described may be carried out on chamber(s) separated from the fabrication system shown in embodiments.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

System controller 1157 is used to control motors, valves, flow controllers, power supplies and other functions required to carry out process recipes described herein. A gas handling system 1155 may also be controlled by system controller 1157 to introduce gases to one or all of the wafer processing chambers 1108a-f. System controller 1157 may rely on feedback from optical sensors to determine and adjust the position of movable mechanical assemblies in gas handling system 1155 and/or in wafer processing chambers 1108a-f. Mechanical assemblies may include the robot, throttle valves and susceptors which are moved by motors under the control of system controller 1157.

In an exemplary embodiment, system controller 1157 includes a hard disk drive (memory), USB ports, a floppy disk drive and a processor. System controller 1157 includes analog and digital input/output boards, interface boards and stepper motor controller boards. Various parts of multi-chamber processing system 1101 which contains substrate processing chamber 1001 are controlled by system controller 1157. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon germanium" of the patterned substrate is predominantly silicon and germanium but may include minority concentrations of other elemental constituents (e.g. oxygen, hydrogen, carbon). Exposed "silicon" of the patterned substrate may be predominantly but may include minority concentrations of other elemental constituents (e.g. nitrogen, hydrogen, carbon). In some embodiments, silicon films etched using the methods described herein consist essentially of silicon.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-fluorine" (or "radical-hydrogen") are radical precursors which contain fluorine (or hydrogen) but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching silicon, the method comprising:
flowing a fluorine-containing precursor and an hydrogen-containing precursor into a remote plasma region fluidly coupled to a substrate processing region via through-holes in a showerhead;
forming a remote plasma in the remote plasma region to produce plasma effluents from the fluorine-containing precursor and the hydrogen-containing precursor; and
etching the silicon from a substrate disposed within the substrate processing region by flowing the plasma effluents into the substrate processing region through the through-holes in the showerhead, wherein the substrate is a patterned substrate which further comprises an exposed region of silicon germanium and the silicon is etched faster than the exposed region of silicon germanium.

2. The method of claim 1 wherein a flow rate of the hydrogen-containing precursor is greater than twice the flow rate of the fluorine-containing precursor.

3. The method of claim 1 wherein an atomic percentage of germanium in the silicon germanium is between about 28% and 70%.

4. The method of claim 1 wherein a temperature of the substrate is greater than or about 100° C. and less than or about 220° C. during the etching operation.

* * * * *